United States Patent
Abe et al.

(10) Patent No.: US 9,401,615 B2
(45) Date of Patent: Jul. 26, 2016

(54) CHARGING AND DISCHARGING CONTROL CIRCUIT AND BATTERY DEVICE

(71) Applicant: Seiko Instruments Inc., Chiba-shi, Chiba (JP)

(72) Inventors: Satoshi Abe, Chiba (JP); Atsushi Sakurai, Chiba (JP)

(73) Assignee: SII SEMICONDUCTOR CORPORATION, Chiba (JP)

( * ) Notice: Subject to any disclaimer, the term of this patent is extended or adjusted under 35 U.S.C. 154(b) by 190 days.

(21) Appl. No.: 14/489,204

(22) Filed: Sep. 17, 2014

(65) Prior Publication Data

US 2015/0084599 A1   Mar. 26, 2015

(30) Foreign Application Priority Data

Sep. 20, 2013 (JP) ................................. 2013-195775

(51) Int. Cl.
*H02J 7/00* (2006.01)

(52) U.S. Cl.
CPC ............. *H02J 7/0063* (2013.01); *H02J 7/0031* (2013.01); *H02J 7/007* (2013.01); *H02J 2007/004* (2013.01); *H02J 2007/0037* (2013.01); *H03K 2217/0054* (2013.01)

(58) Field of Classification Search
CPC ................................. H02J 7/007; H02J 7/0042
USPC .................................................. 320/128, 134
See application file for complete search history.

(56) References Cited

FOREIGN PATENT DOCUMENTS

JP         2000-102182 A      4/2000

*Primary Examiner* — Edward Tso
*Assistant Examiner* — Dung V Bui
(74) *Attorney, Agent, or Firm* — Brinks Gilson & Lione

(57) ABSTRACT

A charging and discharging control circuit includes a switching circuit that controls the gate of a bidirectional conduction type field effect transistor; a first transistor of which the drain is connected to the drain of the bidirectional conduction type field effect transistor, the gate is connected to the source of the bidirectional conduction type field effect transistor, and the source and the back gate are connected to a first terminal of the switching circuit; and a second transistor of which the drain is connected to the source of the bidirectional conduction type field effect transistor, the gate is connected to the drain of the bidirectional conduction type field effect transistor, and the source and the back gate are connected to the first terminal of the switching circuit. The back gate of the bidirectional conduction type field effect transistor is connected to the first terminal of the switching circuit.

4 Claims, 3 Drawing Sheets

CHARGING AND DISCHARGING CONTROL CIRCUIT AND BATTERY DEVICE

RELATED APPLICATIONS

This application claims priority under 35 U.S.C. §119 to Japanese Patent Application No. 2013-195775 filed on Sep. 20, 2013, the entire content of which is hereby incorporated by reference.

BACKGROUND OF THE INVENTION

1. Field of the Invention

The present invention relates to a charging and discharging control circuit that detects a voltage or abnormality of a secondary battery and a battery device having the charging and discharging control circuit, and more particularly, to a charging and discharging control circuit that can perform a control with a single charging and discharging control MOSFET and a battery device having the charging and discharging control circuit.

2. Background Art

FIG. 3 is a circuit diagram of a battery device having a charging and discharging control circuit according the related art. In the battery device having the charging and discharging control circuit according to the related art, an enhancement type N-channel MOSFET 306 that can bi-directionally intercept electric conduction is connected in series to a negative electrode side of a secondary battery 101. A charging circuit or a load is connected between a V+ terminal 120 and a V− terminal 121 and a charging and discharging current is supplied to or discharged from the secondary battery 101 via the terminals. A control circuit 102 detects the voltages of the secondary battery 101 and the enhancement type N-channel MOSFET 306 and controls the turning-on and turning-off of switches 301, 304, and 305 depending on the detected values. In the enhancement type N-channel MOSFET 306, the drain terminal and the source terminal can bi-directionally conduct electricity to each other when the potential of the gate terminal is equal to or greater than a positive threshold voltage, and the electric conduction between the drain terminal and the source terminal is intercepted when the potential of the gate terminal is less than the threshold voltage.

A charging inhibited state will be described below. When a charger is connected between the V+ terminal 120 and the V− terminal 121, the voltage Vds between the drain terminal and the source terminal of the enhancement type N-channel MOSFET 306 has a positive value. The control circuit 102 detects that Vds is positive, turns on the switch 301, and turns off the switches 304 and 305. Accordingly, the gate terminal of the enhancement type N-channel MOSFET 306 has a potential higher by the voltage of the secondary battery 101 than the source terminal and the enhancement type N-channel MOSFET 306 is switched to an electrically-connected state.

When the secondary battery 101 is charged and the battery voltage reaches a set upper limit value, the control circuit 102 turns off the switch 301 and turns on the switches 304 and 305. Then, the gate terminal of the enhancement type N-channel MOSFET 306 has the same potential as the source terminal and the enhancement type N-channel MOSFET 306 is switched to an OFF state. As a result, a charging current is intercepted to prevent the secondary battery 101 from being overcharged. At this time, a diode 302 is reversely biased to prevent a current from flowing through the switch 304 and the switch 305.

When the charging current is intercepted, a voltage drop due to internal resistance disappears and the voltage of the secondary battery 101 decreases. In order to prevent charging from being restarted due to the decrease in voltage, the charging inhibited state only has to be maintained until the secondary battery 101 is discharged to a certain extent and the voltage thereof becomes equal to or less than a set value after the charging is inhibited. When a load is connected between the V+ terminal 120 and the V− terminal 121 in the charging inhibited state, Vds is switched from positive to negative. The control circuit 102 only has to control the switches 301, 304, and 305 so as to discharge the secondary battery when Vds is negative and to intercept the charging current when Vds is positive.

In the above description, both switches 304 and 305 are turned on at the time of stopping the charging. However, even when the switch 304 is turned off, the charging can be similarly stopped. Since the switch 305 is turned on regardless of the turning-on and turning-off of the switch 304, the gate terminal has the same potential as the source terminal and the enhancement type N-channel MOSFET 306 is turned off. This is because the current flowing through the switches 304 and 305 is also intercepted by the diode 302.

At the above-described time of charging and at the time of discharging to be described later, the switches 304 and 305 are turned off. Accordingly, when the switches 304 and 305 are turned on at the time of stopping the charging and the switches 304 and 305 are turned on at the time of stopping the discharging as will be described later, two switches are always simultaneously turned on or turned off. As a result, it is not necessary to independently control the switches 304 and 305 and it is possible to simplify the configuration of the control circuit.

A discharging inhibited state will be described below. When a load is connected between the V+ terminal 120 and the V− terminal 121, the voltage Vds between the drain terminal and the source terminal of the enhancement type N-channel MOSFET 306 has a negative value. The control circuit 102 detects that Vds is negative, turns on the switch 301, and turns off the switches 304 and 305. Accordingly, the gate terminal of the enhancement type N-channel MOSFET 306 has a potential higher by the voltage of the secondary battery 101 than the drain terminal and the enhancement type N-channel MOSFET 306 is switched to an electrically-connected state.

When the secondary battery 101 is discharged and the battery voltage reaches a set lower limit value, the control circuit 102 turns off the switch 301 and turns on the switches 304 and 305. Then, the gate terminal of the enhancement type N-channel MOSFET 306 has the same potential as the drain terminal and the enhancement type N-channel MOSFET 306 is switched to the OFF state. As a result, a discharging current is intercepted to prevent the secondary battery 101 from being over-discharged. At this time, a diode 303 is reversely biased to prevent a current from flowing through the switch 304 and the switch 305.

When the discharging current is intercepted, a voltage drop due to internal resistance disappears and the voltage of the secondary battery 101 increases. In order to prevent discharging from being restarted due to the increase in voltage, the discharging inhibited state only has to be maintained until the secondary battery 101 is charged to a certain extent and the voltage thereof becomes equal to or greater than a set value after the discharging is inhibited. When a charging circuit is connected between the V+ terminal 120 and the V− terminal 121 in the discharging inhibited state, Vds is switched from negative to positive. The control circuit 102 only has to control the switches 301, 304, and 305 so as to charge the secondary battery when Vds is positive and to intercept the discharging current when Vds is negative.

In the above description, both switches 304 and 305 are turned on at the time of stopping the discharging. However, even when the switch 305 is turned off, the discharging can be similarly stopped. Since the switch 304 is turned on regardless of the turning-on and turning-off of the switch 305, the gate terminal has the same potential as the drain terminal and the enhancement type N-channel MOSFET 306 is turned off. This is because the current flowing through the switches 304 and 305 is also intercepted by the diode 303.

When both switches 304 and 305 are turned on at the time of stopping the discharging, two switches are always simultaneously turned on or turned off as described above. Accordingly, it is not necessary to independently control the switches 304 and 305 and it is possible to simplify the configuration of the control circuit 102.

The enhancement type N-channel MOSFET 306 has diodes 321 and 322 built therein. However, these diodes are reversely connected in series to each other and thus are not electrically connected, which does not affect the above-mentioned protection operation.

The enhancement type N-channel MOSFET 306 may have a horizontal structure or a vertical structure. When the horizontal structure is employed, the enhancement type N-channel MOSFET 306 and the control circuit 102 can be easily configured as a single IC. Accordingly, since the overcharge and over-discharge protecting circuit including one IC and two switches in the related art can be configured as a single IC, it is possible to achieve a decrease in size and a decrease in cost. On the other hand, when the vertical structure is employed, it is possible to achieve a decrease in loss in comparison with the horizontal structure.

[Patent Document 1] Japanese Patent Application Laid-Open No. 2000-102182 (FIG. 9)

SUMMARY OF THE INVENTION

However, in the related art, since the switches 304 and 305 need to be controlled, there is a problem in that the control of the control circuit 102 is complicated. There is also a problem in that since the gate voltage of the enhancement type N-channel MOSFET 306 decreases up to only the source or drain voltage +VF (about 0.6 V), a leakage current is large at the time of turning off the enhancement type N-channel MOSFET 306. There is also a problem in that the back gate of the enhancement type N-channel MOSFET 306 is floated and the operation of the battery device including the charging and discharging control circuit is destabilized.

The present invention is made to solve the above-mentioned problems and an object thereof is to provide a charging and discharging control circuit that can reduce a leakage current at the time of turning off the charging and discharging control circuit without complicating the control of a control circuit and that can stably operate and a battery device having the charging and discharging control circuit.

In order to solve the above-mentioned problems, a charging and discharging control circuit and a battery device including the charging and discharging control circuit according to the invention have the following configurations.

A charging and discharging control circuit includes: a switching circuit that controls the gate of a bidirectional conduction type field effect transistor on the basis of an output of a control circuit; a first transistor of which the drain is connected to the drain of the bidirectional conduction type field effect transistor, the gate is connected to the source of the bidirectional conduction type field effect transistor, and the source and the back gate are connected to a first terminal of the switching circuit; and a second transistor of which the drain is connected to the source of the bidirectional conduction type field effect transistor, the gate is connected to the drain of the bidirectional conduction type field effect transistor, and the source and the back gate are connected to the first terminal of the switching circuit.

A battery device includes: a secondary battery and the charging and discharging control circuit.

The battery device having the charging and discharging control circuit according to the invention can reduce a leakage current at the time of turning off the charging and discharging control circuit without complicating the control of the control circuit by controlling the gate of the bidirectional conduction type field effect transistor to the source or drain voltage thereof. The battery device can stably operate by controlling the back gate of the bidirectional conduction type field effect transistor.

DETAILED DESCRIPTION OF THE PREFERRED EMBODIMENTS

First Embodiment

Figure 1:
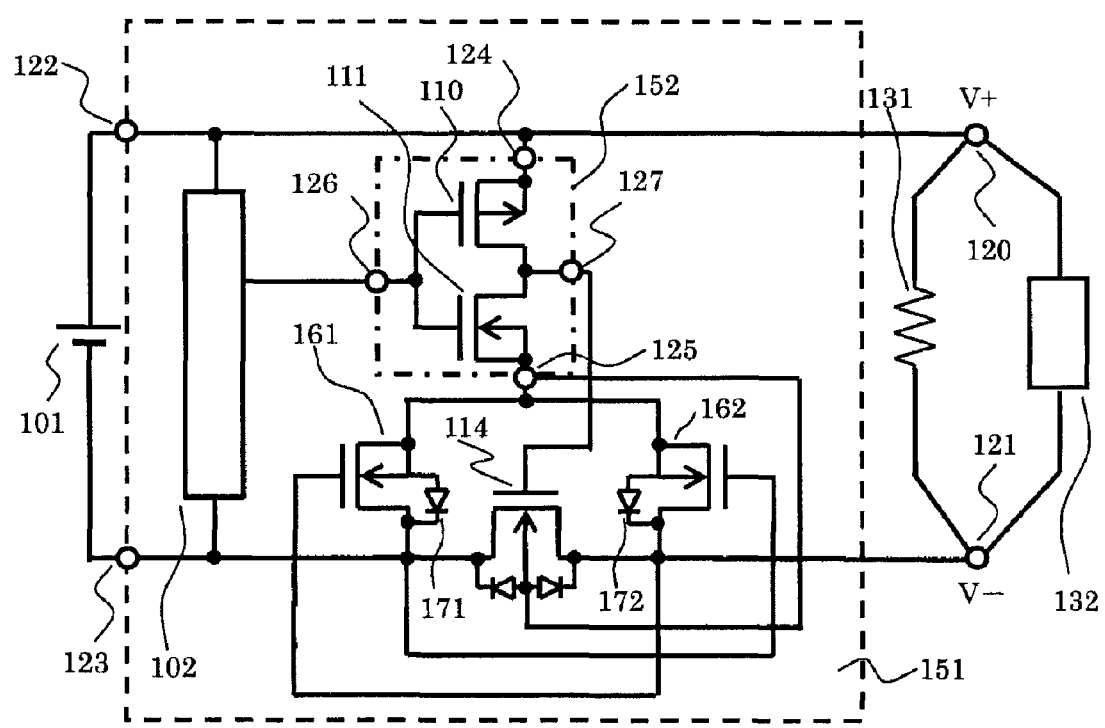
FIG. 1 is a circuit diagram illustrating a battery device including a charging and discharging control circuit according to a first embodiment.

FIG. 1 is a circuit diagram illustrating a battery device including a charging and discharging control circuit 151 according to a first embodiment.

The battery device according to the first embodiment includes a secondary battery 101, a charging and discharging control circuit 151, and a V+ terminal 120 and a V− terminal 121 between which a charger 132 and a load 131 are connected. The charging and discharging control circuit 151 includes a control circuit 102, an N-channel bidirectional conduction type field effect transistor 114, a switching circuit 152, and NMOS transistors 161 and 162. The switching circuit 152 includes a PMOS transistor 110, an NMOS transistor 111, and terminals 124, 125, 126, and 127.

The secondary battery 101 is connected to a positive power supply terminal 122 and a negative power supply terminal 123. In the control circuit 102, a positive power supply is connected to the positive power supply terminal 122, a negative power supply is connected to the negative power supply terminal 123, and an output terminal is connected to the gate of the PMOS transistor 110 and the gate of the NMOS transistor 111 via the terminal 126. The source and the back gate of the PMOS transistor 110 are connected to the positive power supply terminal 122 and the V+ terminal 120 via the terminal 124 and the drain thereof is connected to the drain of the NMOS transistor 111 and the terminal 127. The source and the back gate of the NMOS transistor 111 are connected to the terminal 125. The drain of the NMOS transistor 161 is connected to the negative power supply terminal 123, the source and the back gate thereof are connected to the terminal 125, and the gate thereof is connected to the V− terminal 121. The drain of the NMOS transistor 162 is connected to the V− terminal 121, the source and the back gate thereof are connected to the terminal 125, and the gate thereof is connected to the negative power supply terminal 123. The drain of the N-channel bidirectional conduction type field effect transistor 114 is connected to the negative power supply terminal 123, the source thereof is connected to the V− terminal 121, the gate thereof is connected to the terminal 127, and the back gate thereof is connected to the terminal 125.

The operation of the battery device according to the first embodiment will be described below.

When the charger 132 is connected between the V+ terminal 120 and the V− terminal 121 and it is detected that the secondary battery 101 is in a chargeable state, the control circuit 102 outputs a Low signal from the output terminal thereof to the terminal 126. Then, the control circuit 102 turns on the PMOS transistor 110 and turns off the NMOS transistor 111. Since the gate thereof is connected to the positive power supply terminal 122, the N-channel bidirectional conduction type field effect transistor 114 is turned on. In this way, the charging and discharging control circuit 151 controls the charging and discharging of the secondary battery 101.

When the secondary battery 101 is charged with the charger 132 and the control circuit 102 detects the overcharged state of the secondary battery 101, the control circuit 102 outputs a High signal from the output terminal thereof to the terminal 126. Then, the control circuit 102 turns off the PMOS transistor 110 and the turns on the NMOS transistor 111. Since the gate thereof is connected to the terminal 125, the N-channel bidirectional conduction type field effect transistor 114 is turned off. In this way, the charging current is intercepted to prevent the secondary battery 101 from being overcharged.

Here, when the N-channel bidirectional conduction type field effect transistor 114 is turned off, the V− terminal 121 has a voltage lower than that of the negative power supply terminal 123. Accordingly, the NMOS transistor 161 is turned off and the NMOS transistor 162 is turned on. Since the gate and the back gate thereof are connected to the V− terminal 121, the N-channel bidirectional conduction type field effect transistor 114 can reduce a leakage current and can stably operate. Since a parasitic diode 171 of the turned-off NMOS transistor 161 is reversely biased, a current does not flow from the negative power supply terminal 123 to the V− terminal 121 via the NMOS transistors 161 and 162.

When the load 131 is driven by the secondary battery 101 and the control circuit 102 detects the over-discharged state of the secondary battery 101, the control circuit 102 outputs a High signal from the output terminal thereof to the terminal 126. Then, the control circuit 102 turns off the PMOS transistor 110 and turns on the NMOS transistor 111. Since the gate thereof is connected to the terminal 125, the N-channel bidirectional conduction type field effect transistor 114 is turned off. In this way, the discharging current is intercepted to prevent the secondary battery 101 from being over-discharged.

Here, when the N-channel bidirectional conduction type field effect transistor 114 is turned off, the negative power supply terminal 123 has a voltage lower than that of the V− terminal 121. Accordingly, the NMOS transistor 161 is turned on and the NMOS transistor 162 is turned off. Since the gate and the back gate thereof are connected to the negative power supply terminal 123, the N-channel bidirectional conduction type field effect transistor 114 can reduce a leakage current and can stably operate. Since a parasitic diode 172 of the turned-off NMOS transistor 162 is reversely biased, a current does not flow from the V− terminal 121 to the negative power supply terminal 123 via the NMOS transistors 161 and 162.

As described above, the battery device including the charging and discharging control circuit 151 according to this embodiment can reduce the leakage current flowing in the N-channel bidirectional conduction type field effect transistor 114 without complicating the control of the control circuit 102. By connecting the back gate of the N-channel bidirectional conduction type field effect transistor 114 to the V− terminal 121 or the negative power supply terminal 123, it is possible to cause the charging and discharging control circuit 151 to stably operate.

The control circuit 102 of this embodiment connects the power supply terminal to the positive power supply terminal 122 and the negative power supply terminal 123, but may connect the power supply terminal to the terminal 125. In this case, the lower voltage of the negative power supply terminal 123 and the terminal 125 is selected as the negative power supply and a Low signal is output from the output terminal. By employing this configuration, the switching circuit 152 can more stably operate.

Second Embodiment

Figure 2:
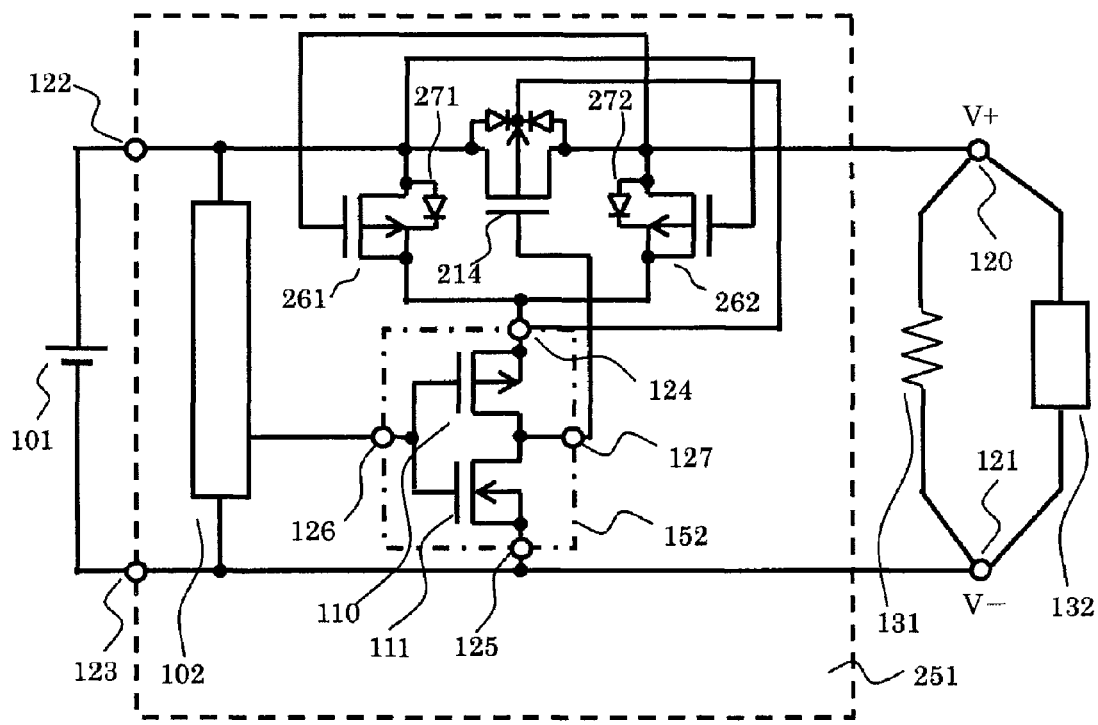
FIG. 2 is a circuit diagram illustrating a battery device including a charging and discharging control circuit according to a second embodiment.
Figure 3:
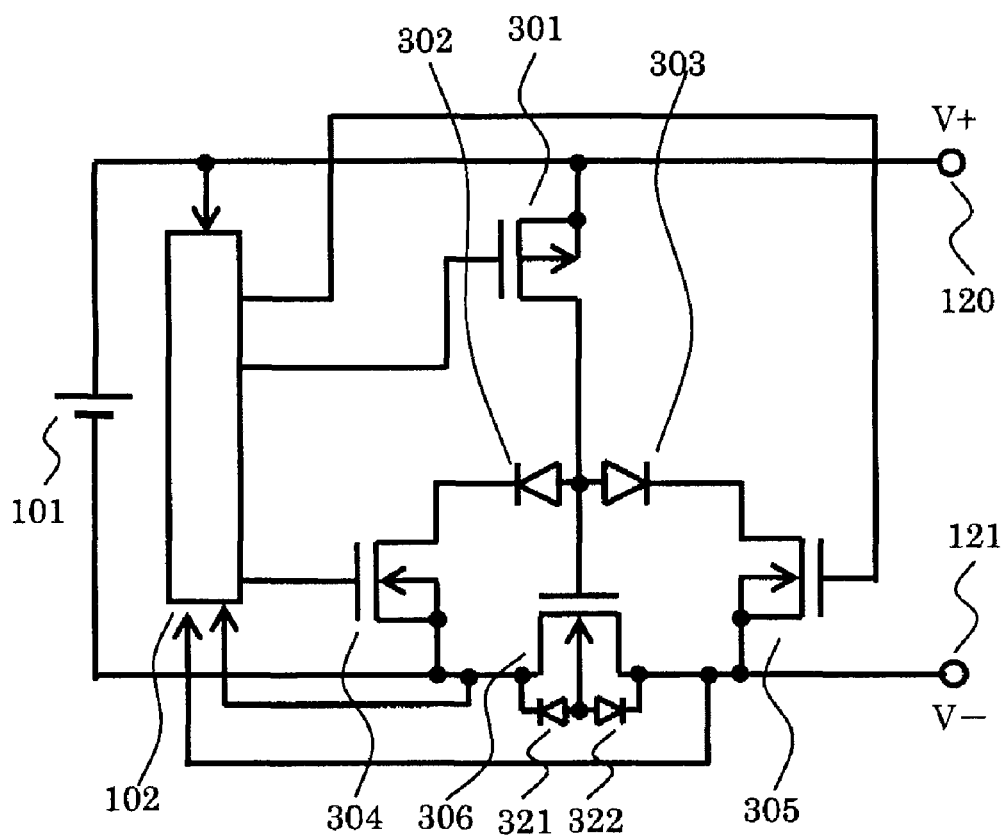
FIG. 3 is a circuit diagram illustrating a battery device including a charging and discharging control circuit according to the related art.

FIG. 2 is a circuit diagram illustrating a battery device including a charging and discharging control circuit 251 according to a second embodiment.

The battery device according to the second embodiment includes a secondary battery 101, a charging and discharging control circuit 251, and a V+ terminal 120 and a V− terminal 121 between which a charger 132 and a load 131 are connected. The charging and discharging control circuit 251 includes a control circuit 102, a P-channel bidirectional conduction type field effect transistor 214, a switching circuit 152, and PMOS transistors 261 and 262. The switching circuit 152 includes a PMOS transistor 110, an NMOS transistor 111, and terminals 124, 125, 126, and 127.

The secondary battery 101 is connected to a positive power supply terminal 122 and a negative power supply terminal 123. In the control circuit 102, a positive power supply is connected to the positive power supply terminal 122, a negative power supply is connected to the negative power supply terminal 123, and an output terminal is connected to the gate of the PMOS transistor 110 and the gate of the NMOS transistor 111 via the terminal 126. The source and the back gate of the PMOS transistor 110 are connected to the terminal 124 and the drain thereof is connected to the drain of the NMOS transistor 111 and the terminal 127. The source and the back gate of the NMOS transistor 111 are connected to the negative power supply terminal 123 and the V− terminal 121 via the terminal 125. The drain of the PMOS transistor 261 is connected to the positive power supply terminal 122, the source and the back gate thereof are connected to the terminal 124, and the gate thereof is connected to the V+ terminal 120. The drain of the PMOS transistor 262 is connected to the V+ terminal 120, the source and the back gate thereof are connected to the terminal 124, and the gate thereof is connected to the positive power supply terminal 122. The drain of the P-channel bidirectional conduction type field effect transistor 214 is connected to the positive power supply terminal 122, the source thereof is connected to the V+ terminal 120, the gate thereof is connected to the terminal 127, and the back gate thereof is connected to the terminal 124.

The operation of the battery device according to the second embodiment will be described below.

When the charger 132 is connected between the V+ terminal 120 and the V− terminal 121 and it is detected that the secondary battery 101 is in a chargeable state, the control circuit 102 outputs a High signal from the output terminal thereof to the terminal 126. Then, the control circuit 102 turns off the PMOS transistor 110 and turns on the NMOS transistor 111. Since the gate thereof is connected to the negative power supply terminal 123, the P-channel bidirectional conduction type field effect transistor 214 is turned on. When the P-channel bidirectional conduction type field effect transistor 214 is turned on, the PMOS transistors 261 and 262 have the same gate, source, and drain voltages and thus are turned off. In this way, the charging and discharging control circuit 251 controls the charging of the secondary battery 101.

When the secondary battery 101 is charged with the charger 132 and the control circuit 102 detects the overcharged state of the secondary battery 101, the control circuit 102 outputs a Low signal from the output terminal thereof to the terminal 126. Then, the control circuit 102 turns on the PMOS transistor 110 and turns off the NMOS transistor 111. Since the gate thereof is connected to the terminal 124, the P-channel bidirectional conduction type field effect transistor 214 is turned off In this way, the charging current is intercepted to prevent the secondary battery 101 from being overcharged.

Here, when the P-channel bidirectional conduction type field effect transistor 214 is turned off, the V+ terminal 120 has a voltage higher than that of the positive power supply terminal 122. Accordingly, the PMOS transistor 261 is turned off and the PMOS transistor 262 is turned on. Since the gate and the back gate thereof are connected to the V+ terminal 120, the P-channel bidirectional conduction type field effect transistor 214 can reduce a leakage current and can stably operate. Since a parasitic diode 271 of the turned-off PMOS transistor 261 is reversely biased, a current does not flow from the V+ terminal 120 to the positive power supply terminal 122 via the PMOS transistors 261 and 262.

When the load 131 is driven by the secondary battery 101 and the control circuit 102 detects the over-discharged state of the secondary battery 101, the control circuit 102 outputs a Low signal from the output terminal thereof to the terminal 126. Then, the control circuit 102 turns on the PMOS transistor 110 and turns off the NMOS transistor 111. Since the gate thereof is connected to the terminal 124, the P-channel bidirectional conduction type field effect transistor 214 is turned off In this way, the discharging current is intercepted to prevent the secondary battery 101 from being over-discharged.

Here, when the P-channel bidirectional conduction type field effect transistor 214 is turned off, the V+ terminal 120 has a voltage lower than that of the positive power supply terminal 122. Accordingly, the PMOS transistor 261 is turned on and the PMOS transistor 262 is turned off Since the gate and the back gate thereof are connected to the positive power supply terminal 122, the P-channel bidirectional conduction type field effect transistor 214 can reduce a leakage current and can stably operate. Since a parasitic diode 272 of the turned-off PMOS transistor 262 is reversely biased, a current does not flow from the positive power supply terminal 122 to the V+ terminal 120 via the PMOS transistors 261 and the PMOS transistor 262.

As described above, the battery device including the charging and discharging control circuit 251 according to the second embodiment can reduce the leakage current flowing in the P-channel bidirectional conduction type field effect transistor 214 without complicating the control of the control circuit 102. By connecting the back gate of the P-channel bidirectional conduction type field effect transistor 214 to the V+ terminal 120 or the positive power supply terminal 122, it is possible to cause the charging and discharging control circuit 251 to stably operate.

The control circuit 102 of this embodiment connects the power supply terminal to the positive power supply terminal 122 and the negative power supply terminal 123, but may connect the power supply terminal to the terminal 124. In this case, the higher voltage of the positive power supply terminal 122 and the terminal 124 is selected as the positive power supply and a High signal is output from the output terminal. By employing this configuration, the switching circuit 152 can more stably operate.

What is claimed is:

1. A charging and discharging control circuit having a control circuit that controls charging and discharging of a secondary battery using a single bidirectional conduction type field effect transistor, comprising:
    a switching circuit that controls the gate of the bidirectional conduction type field effect transistor on the basis of an output of the control circuit;
    a first transistor of which the drain is connected to the drain of the bidirectional conduction type field effect transistor, the gate is connected to the source of the bidirectional conduction type field effect transistor, and the source and the back gate are connected to a first terminal of the switching circuit; and
    a second transistor of which the drain is connected to the source of the bidirectional conduction type field effect transistor, the gate is connected to the drain of the bidirectional conduction type field effect transistor, and the source and the back gate are connected to the first terminal of the switching circuit.

2. The charging and discharging control circuit according to claim 1, wherein the first terminal is connected to the back gate of the bidirectional conduction type field effect transistor.

3. The charging and discharging control circuit according to claim 1, wherein the switching circuit includes:
    a third MOS transistor of which the gate is connected to an output terminal of the control circuit and the drain is connected to the gate of the bidirectional conduction type field effect transistor; and
    a fourth MOS transistor of which the gate is connected to the output terminal of the control circuit, the drain is connected to the gate of the bidirectional conduction type field effect transistor, and the source is connected to the first terminal.

4. A battery device comprising:
    a secondary battery that is able to be charged and discharged; and
    the charging and discharging control circuit according to claim 1 that monitors a voltage of the secondary battery and that controls charging and discharging of the secondary battery.

* * * * *